United States Patent
Hasegawa et al.

(10) Patent No.: US 9,074,278 B2
(45) Date of Patent: Jul. 7, 2015

(54) CARBON FILM LAMINATE

(75) Inventors: Masataka Hasegawa, Tsukuba (JP); Masatou Ishihara, Tsukuba (JP); Yoshinori Koga, Tsukuba (JP); Jaeho Kim, Tsukuba (JP); Kazuo Tsugawa, Tsukuba (JP); Sumio Iijima, Tsukuba (JP)

(73) Assignee: NATIONAL INSTITUTE OF ADVANCED INDUSTRIAL SCIENCE AND TECHNOLOGY (JP)

( * ) Notice: Subject to any disclaimer, the term of this patent is extended or adjusted under 35 U.S.C. 154(b) by 0 days.

(21) Appl. No.: 13/580,468

(22) PCT Filed: Feb. 25, 2011

(86) PCT No.: PCT/JP2011/054243
§ 371 (c)(1),
(2), (4) Date: Nov. 9, 2012

(87) PCT Pub. No.: WO2011/105530
PCT Pub. Date: Sep. 1, 2011

(65) Prior Publication Data
US 2013/0052121 A1 Feb. 28, 2013

(30) Foreign Application Priority Data
Feb. 26, 2010 (JP) .................................. 2010-041419

(51) Int. Cl.
*B21D 39/00* (2006.01)
*C23C 16/02* (2006.01)
(Continued)

(52) U.S. Cl.
CPC .......... *C23C 16/0281* (2013.01); *Y10T 428/30* (2015.01); *B82Y 30/00* (2013.01); *B82Y 40/00* (2013.01); *C01B 31/02* (2013.01); *C23C 16/26* (2013.01); *C30B 29/02* (2013.01); *C30B 29/04* (2013.01); *C30B 29/20* (2013.01); *C01B 31/20* (2013.01); *C01B 31/0453* (2013.01)

(58) Field of Classification Search
None
See application file for complete search history.

(56) References Cited

U.S. PATENT DOCUMENTS 7,311,889 B2 * 12/2007 Awano et al. .............. 423/447.3
2009/0155561 A1 * 6/2009 Choi et al. ..................... 428/220
(Continued)

FOREIGN PATENT DOCUMENTS

CN 101285175 A 10/2008
FR WO2010043716 * 4/2010 .......... C23C 16/0281
(Continued)

OTHER PUBLICATIONS

"The Mono Series" Product Guide, Element Six.*
(Continued)

*Primary Examiner* — Humera Sheikh
*Assistant Examiner* — Seth Dumbris
(74) *Attorney, Agent, or Firm* — Ostrolenk Faber LLP

(57) ABSTRACT

Small crystal size is the issue of a conventional method for formation of a film of graphene by a thermal CVD technique using a copper foil as a substrate. A carbon film laminate is described in which graphene having a larger crystal size is formed. The carbon film laminate is configured to include a sapphire single crystal having a surface composed of terrace surfaces which are flat at the atomic level, and atomic-layer steps, a copper single crystal thin film formed by epitaxial growth on the substrate, and graphene deposited on the copper single crystal thin film, and thus enabling formation of graphene having a large crystal size.

3 Claims, 5 Drawing Sheets

(51) Int. Cl.
B82Y 30/00 (2011.01)
B82Y 40/00 (2011.01)
C01B 31/02 (2006.01)
C23C 16/26 (2006.01)
C30B 29/02 (2006.01)
C30B 29/04 (2006.01)
C30B 29/20 (2006.01)
C01B 31/20 (2006.01)
C01B 31/04 (2006.01)

(56) References Cited

U.S. PATENT DOCUMENTS

2009/0169919 A1* 7/2009 Garcia et al. .......... 428/688
2009/0294759 A1 12/2009 Woo et al. .......... 257/29
2010/0255984 A1* 10/2010 Sutter et al. .......... 502/185
2012/0234679 A1* 9/2012 Garaj et al. .......... 204/520

FOREIGN PATENT DOCUMENTS

| JP | 2009-143799 | 7/2009 |
| KR | 10-2008-0072070 A | 8/2008 |
| KR | 10-2009-0017454 | 2/2009 |
| WO | WO 2011/025045 A1 | 3/2001 |
| WO | WO 2011/025045 A1 | 3/2011 |

OTHER PUBLICATIONS

Tsukamoto et al. "Morphology of Graphene on Step-Controlled Sapphire Sufraces", 2009, Applied Physics Express, vol. 2, pp. 075502-1-075502-3.*

Namiki Precision Jewel "Single Crystal Sapphire" http://web.archive.org/web/20090605011243/http://www.namiki.net/product/ybo/sapphire/index.html.*

Gao et al., "Epitaxial Graphene on Cu(111)", Aug. 2010, Nano Letters, vol. 10, pp. 3512-3516.*

Reddy et al. "High quality, transferrable graphene grown on single crystal Cu(111) thin films on basal-plane sapphire", Mar. 2011, Applied Physics Letters, vol. 98, pp. 113117-1-113117-3.*

International Search Report dated Jun. 7, 2011 issued in corresponding International Patent Application No. PCT/JP2011/054243 with English translation (4 pages).

Xuesong Li et al., Large-Area Synthesis of High-Quality and Uniform Graphene Films on Copper Foils, Science, vol. 324 (2009), pp. 1312-1314.

Xuesong Li et al., Supporting Online Material for Large-Area Synthesis of High-Quality and Uniform Graphene Films on Copper Foils, Science Express (2009).

Xuesong Li et al., "Transfer of Large-Area Graphene Films for High-Performance Transparent Conductive Electrodes", Nano Letters, vol. 9, No. 12 (2009) pp. 4359-4363.

Ariel Ismach et al., "Direct Chemical Vapor Deposition of Graphene on Dielectric Surfaces", Nano Letters, vol. 10, No. 5 (2010) pp. 1542-1548.

Li Gao et al., "Epitaxial Graphene on Cu(111)", Nano Letters, vol. 10, No. 9 (2010), pp. 3512-3516.

International Search Report dated Jun. 7, 2011 issued in corresponding international patent application No. PCT/JP2011/054243.

Chinese Office Action, dated Dec. 3, 2013, issued in corresponding Chinese Patent Application No. 201180020414.5. English translation. Total 15 pages.

Alfonso Reina, et al. "Large Area, Few-Layer Graphene Films on Arbitrary Substrates by Chemical Vapor Deposition" Nano Letters, (2009) vol. 9, No. 1, pp. 30-35.

Korean Intellectual Property Office Action, dated May 27, 2014.

A. C. Ferrari et al., "Raman Spectrum of Graphene and Graphene Layers," Physical Review Letters, 97, Nov. 3, 2006, pp. 187401-1-187401-4.

Notice of Allowance dated Nov. 26, 2014 issued in corresponding Korean Patent Application No. 10-2012-7025248 with English translation.

Chinese Office Action, dated Jul. 18, 2014, issued in corresponding Chinese Patent Application No. 201180020414.5. English translation. Total 18 pages.

Zhongping Zhu, et al. "Handbook For High-Tech Products", Polished Monocrystalline Sapphire Substrate, *China Material Press*, (May 31, 1999) pp. 34-37, English Translation.

* cited by examiner

CARBON FILM LAMINATE

CROSS REFERENCE TO RELATED APPLICATIONS

The present application is a 35 U.S.C. §§371 national phase conversion of PCT/JP2011/054243, filed Feb. 25, 2011, which claims priority of Japanese Patent Application No. 2010-041419, filed Feb. 26, 2010 the contents of which are incorporated by reference herein. The PCT International Application was published in the Japanese language.

TECHNICAL FIELD

The present invention relates to a large area carbon film laminate for use in electronic devices, transparent conductive films and the like.

BACKGROUND ART

Graphene, which is in a form of a flat single layer carbon film composed of sp2-bonded carbon atoms, is expected to be used as a base material such as an ultrahigh performance electronic device and a transparent conductive thin film due to its specifically high electrical conductivity and optical transmittance. Heretofore, methods for formation of graphene have been developed, such as a method for peeling from natural graphite, a method for eliminating silicon by a high-temperature heat treatment of silicon carbide, a method for forming graphene on various metal surfaces and the like.

In particular, a method for forming a single to several layers of graphene on a surface of a copper foil by a chemical vapor deposition (CVD) method has recently been developed (Non-Patent Literatures 1 and 2). The technique of depositing graphene using a copper foil as a base material is performed by a thermal CVD technique. In this technique, a methane gas as a raw material gas is thermally decomposed at approximately 1,000° C. to form a single to several layers of graphene on the surface of the copper foil.

The technique using the copper foil as the base material enables synthesis of graphene with satisfactory utilizing characteristics of a surface of copper, as compared with a conventional technique using other metals such as nickel. In contrast, the graphene obtained by the synthesis method using the copper foil as the base material has a crystal size of several tens of μm at most right now. To use graphene as a material in a high-performance electronic device or the like, there is a need for the graphene to have as large a crystal size as possible, and thus the issue is to increase the crystal size.

CITATION LIST

Non-Patent Literature

[Non-Patent Literature 1]
Xuesong Li, Weiwei Cai, Jinho An, Seyoung Kim, Junghyo Nah, Dongxing Yang, Richard Piner, Aruna Velamakanni, Inhwa Jung, Emanuel Tutuc, Sanjay K. Banerjee, Luigi Colombo, Rodney S. Ruoff, Science, Vol. 324, 2009, pp. 1312-1314.

[Non-Patent Literature 2]
Xuesong Li, Yanwu Zhu, Weiwei Cai, Mark Borysiak, Boyang Han, David Chen, Richard D. Piner, Luigi Colombo, Rodney S. Ruoff, Nano Letters, Vol. 9, 2009, pp. 4359-4363.

SUMMARY OF INVENTION

Technical Problem

The present invention has been made in view of the above circumstances and an object thereof is to solve a problem such as a small crystal size, which is the issue of a conventional method for formation of a film of graphene by a thermal CVD technique using a copper foil as a substrate, and thus providing a carbon film laminate in which graphene having a larger crystal size is formed.

Solution to Problem

The present inventors have intensively studied so as to achieve the above object and found a novel method for obtaining a carbon film laminate in which graphene having a large crystal size is formed, whereby, it is made possible to form graphene with a noticeably larger area as compared with a conventional technique, and thus capable of solving the above issue in the conventional technique.

The present invention has been accomplished based on these findings and includes the following.

[1] A carbon film laminate, including a single crystal substrate, a copper (111) single crystal thin film formed by epitaxial growth on the substrate, and graphene deposited on the copper (111) single crystal thin film.

[2] The carbon film laminate according to [1], wherein the single crystal substrate is a sapphire (0001) or diamond (111) single crystal substrate.

[3] The carbon film laminate according to [1], wherein the single crystal substrate is a sapphire (0001) single crystal substrate having a surface composed of terrace surfaces which are flat at the atomic level, and atomic-layer steps, or a diamond (111) single crystal substrate having a surface composed of terrace surfaces which are flat at the atomic level, and atomic-layer steps.

[4] The carbon film laminate according to any one of [1] to [3], wherein the graphene is formed by a thermal CVD method using a hydrogen gas and a methane gas under reduced pressure.

[5] Graphene deposited on a copper (111) single crystal thin film formed by epitaxial growth on a single crystal substrate.

[6] The graphene according to [5], wherein the graphene is formed by a thermal CVD method using a hydrogen gas and a methane gas under reduced pressure.

[7] The graphene according to [5] or [6], which is obtained by peeling from the copper (111) single crystal thin film.

Advantageous Effects of Invention

According to the carbon film laminate of the present invention in which graphene is deposited on a copper (111) single crystal thin film formed by epitaxial growth on a single crystal substrate, it becomes possible to form graphene having a noticeably larger crystal size (in the 10 mm class) as compared with a conventional one, and thus facilitating the production of ultrahigh performance electronic devices such as a graphene transistor which has hitherto been developed using graphene having a crystal size of several tens of μm. It also becomes possible to integrate the ultrahigh performance device, and thus a graphene transistor having various performances can be produced.

BRIEF DESCRIPTION OF DRAWINGS

FIG. 2-1 is a schematic diagram in cross-section of an ordinary crystal surface having poor flatness.

FIG. 2-2 is a schematic diagram in cross-section of a crystal surface composed of a terrace surface which is flat at the atomic level, and atomic-layer steps.

FIG. 2-3 is a schematic diagram of a crystal surface composed of a terrace surface which is flat at the atomic level, and atomic-layer steps, as seen from above.

FIG. 3 is a schematic diagram illustrating a laminated structure of a carbon film laminate including a sapphire (0001) single crystal substrate, a copper (111) single crystal thin film formed by epitaxial growth on the substrate, and graphene deposited on the copper (111) single crystal thin film of the present invention.

REFERENCE SIGNS LIST

Figure 1:
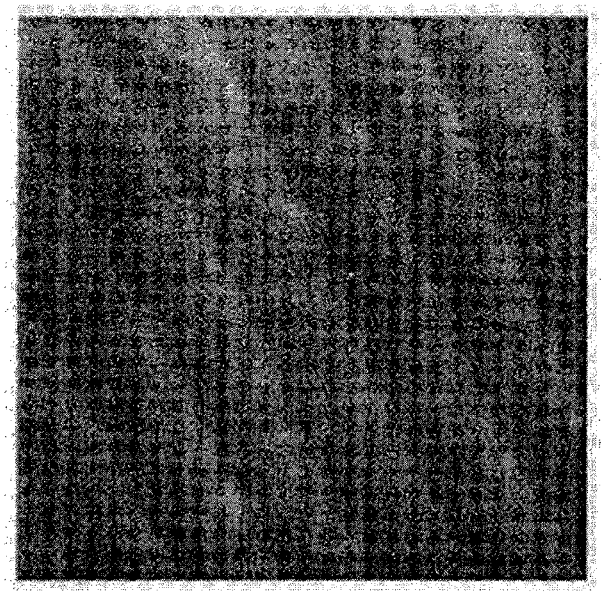
FIG. 1 is an atomic force microscopic image of a sapphire (0001) single crystal substrate having a surface composed of a terrace surface which is flat at the atomic level, and atomic-layer steps.

10 Carbon film laminate
12 Sapphire (0001) single crystal substrate
14 Copper (111) single crystal thin film
16 Graphene

DESCRIPTION OF EMBODIMENTS

Graphene is a flat single layer carbon film composed of sp2-bonded carbon atoms. (Graphene is described in detail in Non-Patent Literature 1.) A carbon film laminate of the present invention in which graphene having a large crystal size is deposited is mainly provided based on the employment of specific production conditions. In the carbon film laminate in which graphene having a large crystal size is formed, a copper (111) single crystal thin film formed by epitaxial growth on a sapphire (0001) single crystal substrate is used as a base material for synthesis of graphene. It is also desired to select the concentration and mole ratio of raw gases, reaction time and the like as the production conditions by a thermal CVD method.

Before the present invention is described, formation of a film of graphene through thermal CVD was performed by the methods disclosed in Non-Patent Literatures 1 and 2 using a copper foil as a base material. Since the copper foil is a polycrystal, its surface is divided into regions each having a different plane direction. Therefore, Raman spectrometry measurement was performed to determine how the thus formed graphene is distributed on a surface of a copper thin film. Furthermore, crystallographic distribution in the plane directions of the surface of the copper foil was determined by electron backscatter diffraction pattern (EBPS). As is apparent from the measurements, a film of graphene is formed in the regions of Cu (111) plane and Cu (100) plane on a surface of the copper foil, and preferably in the region of Cu (111) plane. On the other hand, it became apparent that a film of graphene was scarcely formed in the region of Cu (101) plane of the surface of the copper foil. Thus, it was found in the present invention that a film of graphene is preferably formed on the crystallographic copper (111) plane.

As is apparent from the above results, the copper surface having the region of Cu (111) plane is used as the base material for formation of a graphene film having a large crystal size. Accordingly, single crystal copper having a crystallographic (111) plane is preferably used for formation of a graphene film having a large area.

It is technically possible to prepare a single crystal copper bulk having a crystallographic (111) plane on the surface. However, the single crystal copper bulk is expensive and is unsuited or inappropriate for industrial use. For the purpose of preparing the single crystal copper having a crystallographic (111) plane on the surface, it is more industrially preferable that a Cu (111) single crystal thin film be formed by epitaxial growth on a single crystal substrate. Thus, graphene having a large crystal size is obtained by producing a carbon film laminate, including a single crystal substrate, a copper (111) single crystal thin film formed by epitaxial growth on the substrate, and graphene deposited on the copper (111) single crystal thin film.

In view of the above findings and considerations, a single crystal copper thin film having a crystallographic (111) plane in its surface (hereinafter referred to as a "Cu (111) single crystal thin film") was prepared so as to form a graphene film having a large crystal size. The present inventors has found that a Cu (111) single crystal thin film is formed by epitaxial growth on a single crystal substrate by a magnetron sputtering method, by tests of copper single crystal growth on various substrates. Furthermore, graphene having a large crystal size is obtained by producing a carbon film laminate, including a Cu (111) single crystal thin film formed by epitaxial growth on a sapphire (0001) single crystal substrate, and graphene deposited on the Cu (111) single crystal thin film.

As mentioned above, it was found in the present invention that a Cu (111) single crystal thin film is preferably used to form a graphene film having a large crystal size. Since graphene is a two-dimensional crystal composed of a single carbon atom layer, it is considered that its crystal size is largely influenced by flatness of a surface of a Cu (111) single crystal thin film. Thus, in the present invention, an attempt was made to use a sapphire (0001) single crystal substrate having a surface composed of terrace surfaces which are flat at the atomic level, and atomic-layer steps, as a substrate for epitaxial growth of a Cu (111) single crystal thin film. FIG. 1 is an atomic force microscopic image (in a square-shaped area, the side of which being 2 μm) of the surface of a sapphire (0001) single crystal substrate. As shown in the drawing, stripe pattern contrast exists and is composed of terrace surfaces which are flat at the atomic level, and atomic-layer steps, and the stripe pattern contrast is unique to a very flat single crystal surface. In the present invention, as the substrate for epitaxial growth of a Cu (111) single crystal thin film, a sapphire (0001) single crystal substrate having a surface composed of terrace surfaces which are flat at the atomic level, and atomic-layer steps was used. A description will be made as to the meaning of "single crystal substrate having a surface composed of terrace surfaces which are flat at the atomic level and atomic-layer steps".

Figures 1, 2:
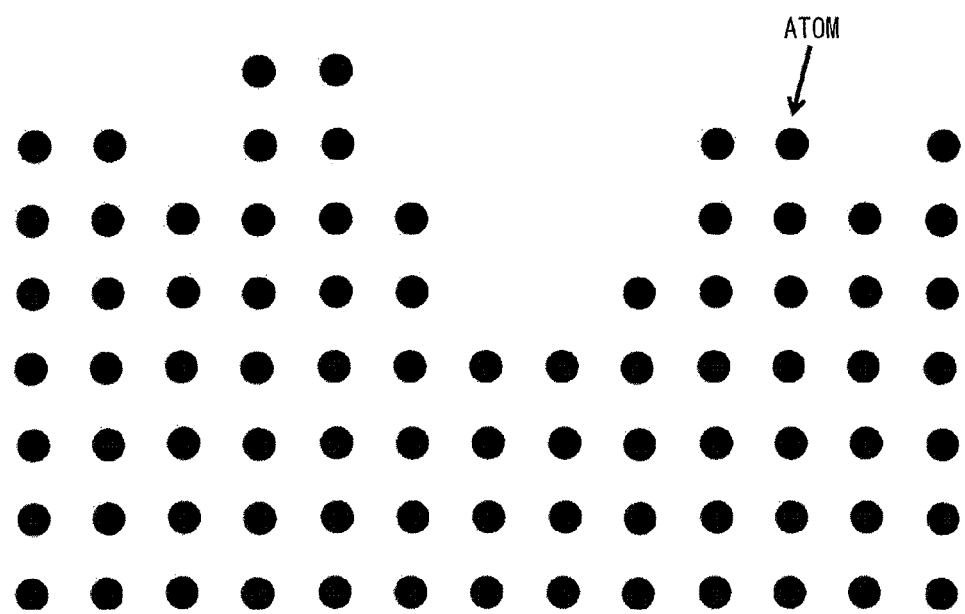
Figure 2:
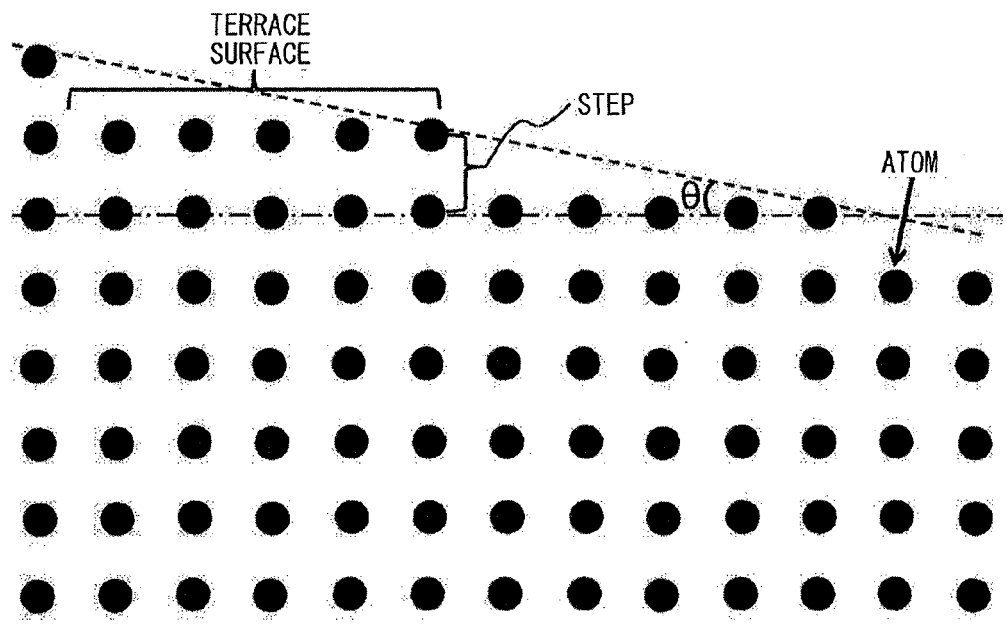
Figures 2, 3:
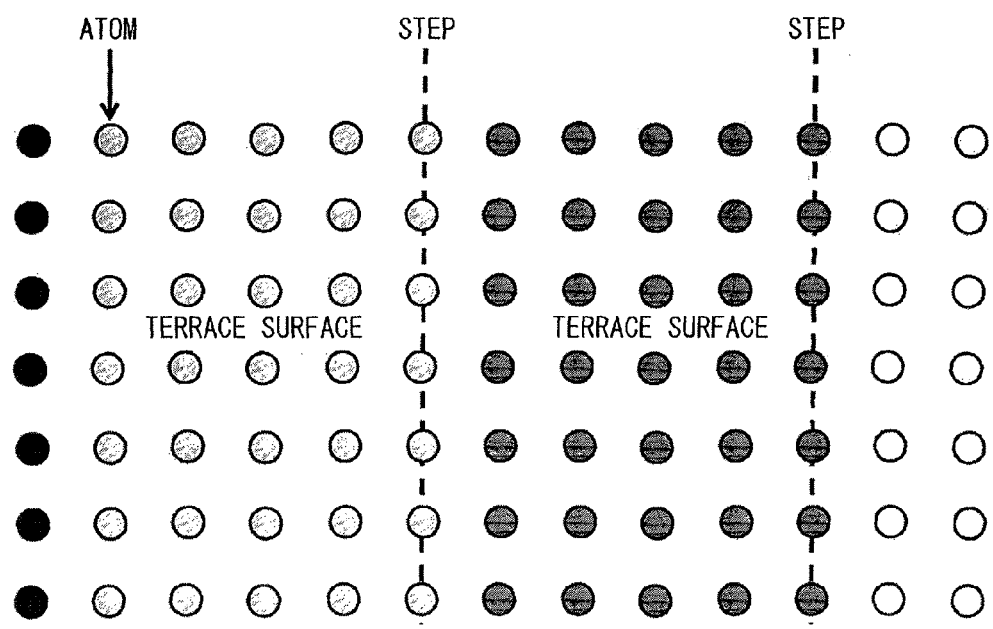
Figure 3:
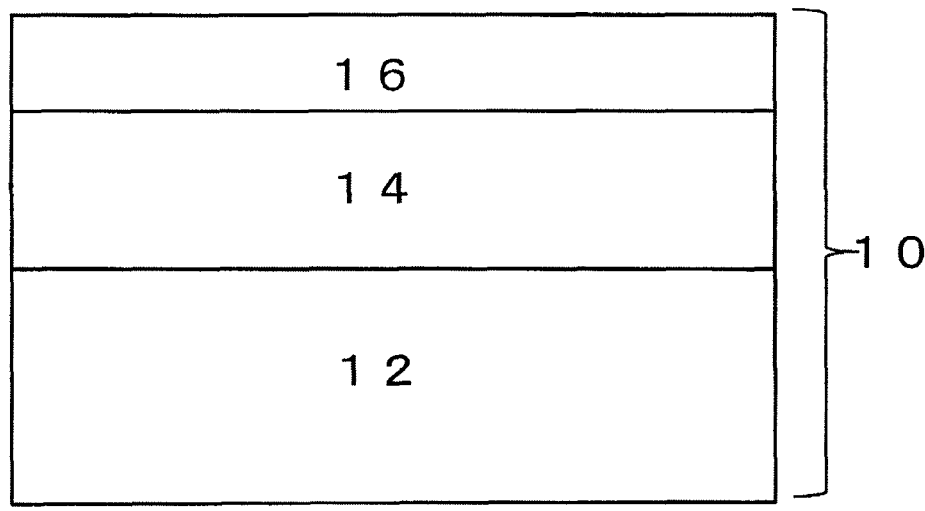

FIG. 2-1 is a schematic diagram in cross-section of an ordinary crystal surface having poor flatness. FIG. 2-2 and FIG. 2-3 are, respectively, a schematic diagram in cross-section of a crystal surface composed of terrace surfaces which are flat at the atomic level, and atomic-layer steps, and a schematic diagram of a crystal surface composed of terrace surfaces which are flat at the atomic level, and atomic-layer steps, as seen from above. In FIG. 2-2, the broken line (---) indicates an inclination of an actual surface, and the dashed line (-•-•-) indicates a crystallographic crystal orientation of a surface.

When extremely satisfactory surface flatness appears, a difference in height between the flat terrace surface at the atomic level and the atomic-layer, i.e. an atomic-layer step, appears at intervals as shown in FIG. 2-2 and FIG. 2-3. The terrace has a width defined by an angle θ between the crystallographic crystal orientation of a surface (-•-•-) and an actual inclination of a surface (---). When such a surface is observed by an atomic force microscope, stripe pattern contrast shown in FIG. 1 is present.

It is preferred to use a Cu (111) single crystal thin film formed by epitaxial growth on a single crystal substrate having a surface composed of terrace surfaces which are flat at the atomic level, and atomic-layer steps, so as to form a graphene film having a large crystal size. Accordingly, it is also possible to use a single crystal material which enables epitaxial growth of a Cu (111) single crystal thin film, in addition to a sapphire single crystal substrate, and also enables formation of a surface composed of terrace surfaces which are flat at the atomic level, and atomic-layer steps. For example, a diamond (111) single crystal substrate is believed to be usable.

In the present invention, graphene having a large crystal size was obtained by forming a carbon film laminate, including a sapphire (0001) single crystal substrate having a surface composed of terrace surfaces which are flat at the atomic level, and atomic-layer steps, a copper (111) single crystal thin film formed by epitaxial growth on the substrate, and graphene deposited on the copper (111) single crystal thin film.

Examples will be described in detail below, but the present invention is not intended to be limited thereto.

FIG. 3 is a schematic diagram illustrating a carbon film laminate according to the present invention. The carbon film laminate 10 includes a sapphire (0001) single crystal substrate 12, a copper (111) single crystal thin film 14 formed by epitaxial growth on the substrate 12, and graphene 16 deposited on the copper (111) single crystal thin film.

The copper (111) single crystal thin film was epitaxially grown on a sapphire (0001) single crystal substrate using a DC magnetron sputtering method. The sapphire (0001) single crystal substrate was placed on a substrate stage capable of heating a substrate, and placed in a sputtering system.

The detailed specifications of a sapphire (0001) single crystal substrate are as follows:
Manufactured and distributed by: Shinkosha Co., Ltd. (http://www.shinkosha.com/index.html)
Name: Sapphire STEP substrate
Material: $Al_2O_3$ (sapphire)
Plane direction: (0001)
Size: measuring 10 mm×10 mm×0.5 mm in thickness
Polished: One surface
Plane direction in tolerance: 0.3° or less
Parallelism: 0.020 mm or less at both ends of substrate of 10 mm in width
Flatness: Optical measurement limit or less
Surface profile: Flat terrace surface at the atomic level, and atomic-layer steps (see in FIG. 1)

The sputtering film formation device was evacuated to the pressure of $2.0\times10^{-4}$ Pa or less before the substrate for film formation was heated to 100° C. and maintained at the temperature. Then, a 1 μm thick Cu (111) single crystal thin film was formed on a sapphire (0001) single crystal substrate under the conditions of a gas pressure of $1.3\times10^{-1}$ Pa and a power of 100 W. Detailed film formation conditions are as follows:
Deposition material: Copper (purity of 99.99% or more)
Preliminary evacuation: $2.0\times10^{-4}$ Pa
Discharge gas: Argon (purity of 99.999% or more)
Discharged power: 100 W (constant power mode)
Discharge current: 370 to 380 mA
Discharge voltage: 338 to 340 V
Discharge gas pressure: $1.3\times10^{-1}$ Pa
Discharge duration: 28 minutes and 6 seconds
Setting film thickness: 1,000 nm
Substrate temperature: approximately 100° C. (measured value of 106 to 113° C. on substrate holder when formed)

It was determined by X-ray diffraction measurement that a copper (111) single crystal thin film was epitaxially grown on a sapphire (0001) single crystal substrate. An X-ray diffractometer used herein is X-RINT 2100 XRD-DSC II manufactured by Rigaku Corporation, and the goniometer is a horizontal goniometer Ultima III manufactured by Rigaku Corporation. On the goniometer, a multipurpose stage for a thin film standard is mounted. The 1 μm thick Cu thin film manufactured according to the above-mentioned procedures was examined by X-ray diffraction while being attached to the sapphire (0001) single crystal substrate. As X-ray, copper (Cu)-Kα1 ray was used. An applied voltage and an applied current of an X-ray tube were 40 kV and 40 mA, respectively. As the X-ray detector, a scintillation counter was used.

A surface of a sample was irradiated with X-ray at an angle of θ, and on the X-ray detector placed at the angle of double θ (2θ) from the X-ray irradiation direction, X-ray intensity emitted from the sample at each 2θ angle was determined while the angle 2θ was varied by rotating at every 0.05 degrees between 40 degrees to 100 degrees (in other words, θ was simultaneously varied by rotating at every 0.025 degrees between 20 degrees to 50 degrees). This measuring method is generally referred to as 2θ-θ measurement, which is intended to detect X-ray reflected by a crystal surface parallel to the sample surface. A computer program used for the measurement is RINT2000/PC software, Windows (registered trademark) version, manufactured by Rigaku Corporation.

Figure 4:
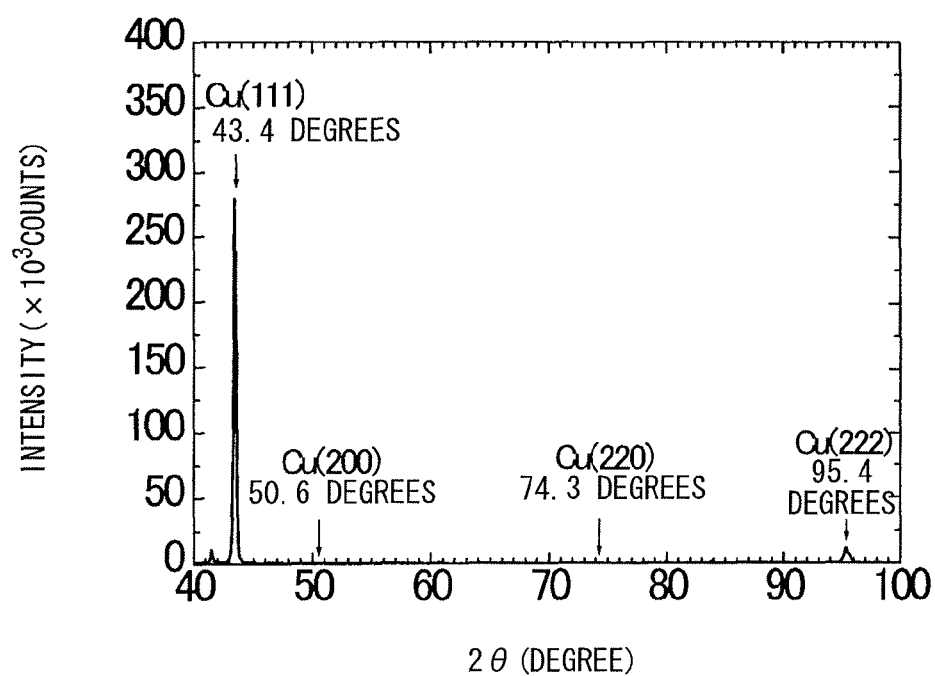
FIG. 4 is an X-ray diffraction spectrum of a copper (111) single crystal thin film formed by epitaxial growth on a sapphire (0001) single crystal substrate (2θ/θ measurement).

FIG. 4 is an X-ray diffraction spectrum thus measured. X-ray used herein is copper (Cu)-Kα1 ray. It is apparent that a clear peak exists at 2θ of 43.4°. This peak is attributed to reflection at Cu (111). Also, a weak peak exists at 2θ of 95.4°, which is attributed to reflection at Cu (222). If the Cu thin film also has a Cu (200) plane element and a Cu (220) plane element parallel to its surface, corresponding peaks should be observed at 2θ of 50.6° and 74.3°, respectively, but none of these peaks were observed. The above results revealed that the Cu thin film was composed of a crystal having the (111) plane parallel to its surface and was a (111) single crystal. Thus, it was confirmed that the copper (111) single crystal thin film was epitaxially grown on the sapphire (0001) single crystal substrate.

In the present invention, graphene was formed by a thermal CVD technique on a surface of a copper (111) single crystal thin film formed by epitaxial growth on a sapphire (0001) single crystal substrate, and thus obtaining a carbon film laminate, as shown in FIG. 3, including a sapphire (0001) single crystal substrate, a copper (111) single crystal thin film formed by epitaxial growth on the substrate, and graphene deposited on the copper (111) single crystal thin film.

As a heating device required for the thermal CVD technique, an infrared gold image furnace capable of performing rapid heating and cooling of the sample and precisely controlling the temperature was used (hereinafter referred to as a furnace). The furnace used herein was MINI-LAMP-ANNEALER "MILA3000-P-N" manufactured by Ulvac-Rico Inc.

Film formation was performed by the following procedures.

(1) On a quartz sample stage of a heating furnace, a copper (111) single crystal thin film formed by epitaxial growth on a sapphire (0001) single crystal substrate (hereinafter referred to as a "base material") was placed, together with the sapphire substrate.

(2) The furnace was closed and then preliminarily evacuated to $3 \times 10^{-4}$ Pa or less.

(3) A hydrogen gas (2 SCCM) was allowed to flow and a pressure in the furnace was maintained at 5.3 Pa.

(4) A heating process was initiated under this condition and the temperature of the base material was raised from room temperature to 1,000° C. over 5 minutes.

(5) At the same time that the temperature of the base material reached 1,000° C., in addition to 2 SCCM of the hydrogen gas, 35 SCCM of methane gas was allowed to flow and then the pressure was increased from 5.3 Pa to 66.5 Pa while maintaining the temperature at 1,000° C. An increase in pressure required 1 minute and 20 seconds.

(6) Film formation of graphene was performed while maintaining the temperature at 1,000° C., a hydrogen gas at 2 SCCM, a methane gas at 35 SCCM and the pressure at 66.5 Pa. Time of film formation was 20 minutes.

(7) After film formation while keeping the above condition for 20 minutes, film formation was terminated. Termination was performed by the following procedures: stop flowing of a methane gas, stop flowing of a hydrogen gas, start evacuation, and then stop heating. Termination procedures required 10 seconds or less.

(8) The film-formed wafer base material was cooled while maintaining the pressure at $1 \times 10^{-3}$ Pa or less by evacuating inside the furnace. The operation of cooling to 300° C. after termination of heating required approximately 6 minutes, and the operation of cooling to approximately to 100° C. required 19 minutes.

(9) After confirming that the base material subjected to film formation was cooled to 100° C. or lower, evacuation was terminated and then air was introduced into the furnace, and then the film-formed base material was removed from the furnace.

Figure 5:
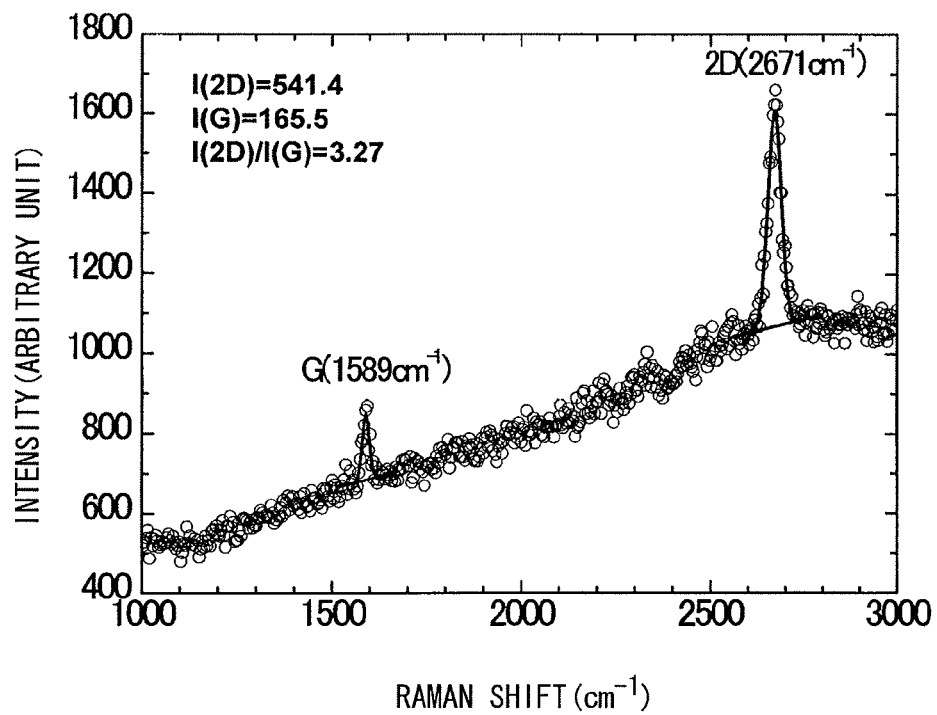
FIG. 5 is a Raman scattering spectrum of graphene formed using, as a base material, a copper (111) single crystal thin film formed by epitaxial growth on a sapphire (0001) single crystal substrate.

To evaluate quality of graphene of a carbon film laminate including a sapphire (0001) single crystal substrate, a copper (111) single crystal thin film formed by epitaxial growth on the substrate, and graphene deposited on the copper (111) single crystal thin film of the present invention, Raman spectrometry measurement was performed. FIG. 5 illustrates a Raman scattering spectrum thus measured. A measurement device is a Model XploRA manufactured by Horiba Ltd., and the measurement was performed under the following conditions: an excitation wavelength of a laser is 632 nm, a spot size of laser beam is 1 micron in diameter, the number of grating lines of a spectroscope is 600 and a measurement time of 5 seconds, and then the measurement was performed twice and the measurement values were accumulated. Measurement was performed in a state where graphene is deposited on a copper (111) single crystal thin film on a sapphire (0001) single crystal substrate.

As shown in FIG. 5, clear peaks were respectively observed at about 2,670 $cm^{-1}$ and 1,590 $cm^{-1}$ of Raman shift, respectively, on a gently-sloping background. The peak at about 1,590 $cm^{-1}$ is attributed to a normal six-membered ring of carbon atoms, which is generally referred to as a G band. The peak at about 2,670 $cm^{-1}$ is generally referred to as a 2D band. The gently-sloping background is attributed to fluorescence emitted from a copper thin film of a base material. In the Raman spectrum of graphene, a peak may be sometimes observed at about 1,358 $cm^{-1}$ and is attributed to a defect of a normal six-membered ring of carbon atoms, and is also referred to as a D band. In FIG. 5, a peak of the D band is not observed, which reveals that graphene produced by the technique of the present invention is a film which is substantially free from defects and has satisfactory crystallinity.

The number of graphene layers composing the film may be identified by a ratio of the intensity of the 2D band to that of the G band in the resulting Raman spectrum of graphene (see above-mentioned Non-Patent Literature 1). Non-Patent Literature 1 discloses that when a ratio of the intensity of the 2D band I(2D) to that of the G band I(G) satisfies I(2D)/I(G)≥2, the film is assumed to be composed of one or two graphene layers.

Each background was subtracted from peaks at the 2D band and the G band shown in FIG. 5, respectively, followed by fitting and further determination of the ratio of intensity by calculation of each area of peaks. As a result, I(2D)/I(G) was 3.27. Accordingly, it was found that the region examined by Raman spectrometry (the region of 1 micron in diameter which is the spot size of measurement laser beam) corresponds to graphene.

Figure 6:
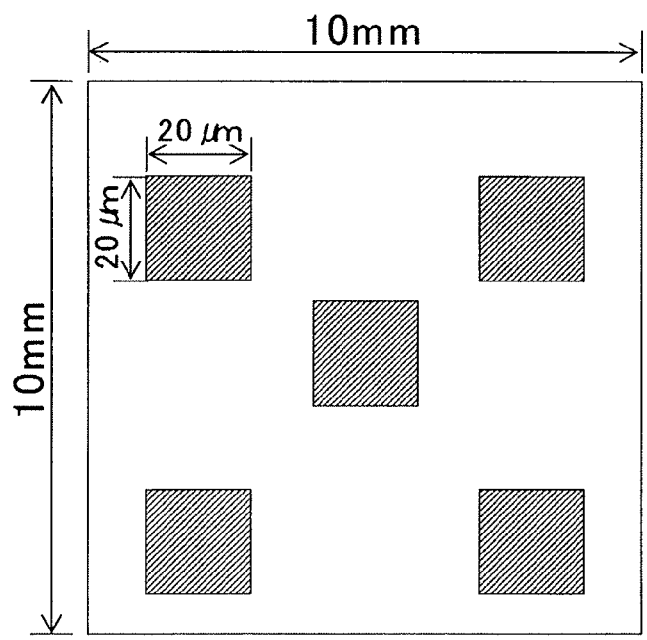
FIG. 6 is a diagram illustrating the position where Raman mapping measurement was performed in a square-shaped area, the side of which being 20 μm.

Next, as shown in FIG. 6, five positions in a surface of a square-shaped area, the side of which being 10 mm of a carbon film laminate were selected, and then Raman measurement was performed in a square-shaped area, the side of which being 20 μm so as to completely fill the square-shaped area, the side of which being 20 μm with laser beam spots every 1 μm of each beam spot size, in other words, Raman measurement was performed at measurement points (21× 21=441 points) per position. As a result, except that the D band was observed at a few points of 441 measurement points on one position among five positions, all of the 441 measurement points satisfied I(2D)/I(G)≥2 on the remaining 4 positions. Accordingly, it was found that in the carbon film laminate of the present invention, graphene has a square-shaped area, the side of which being 20 μm or more on almost all of positions of the surface.

Figure 7:
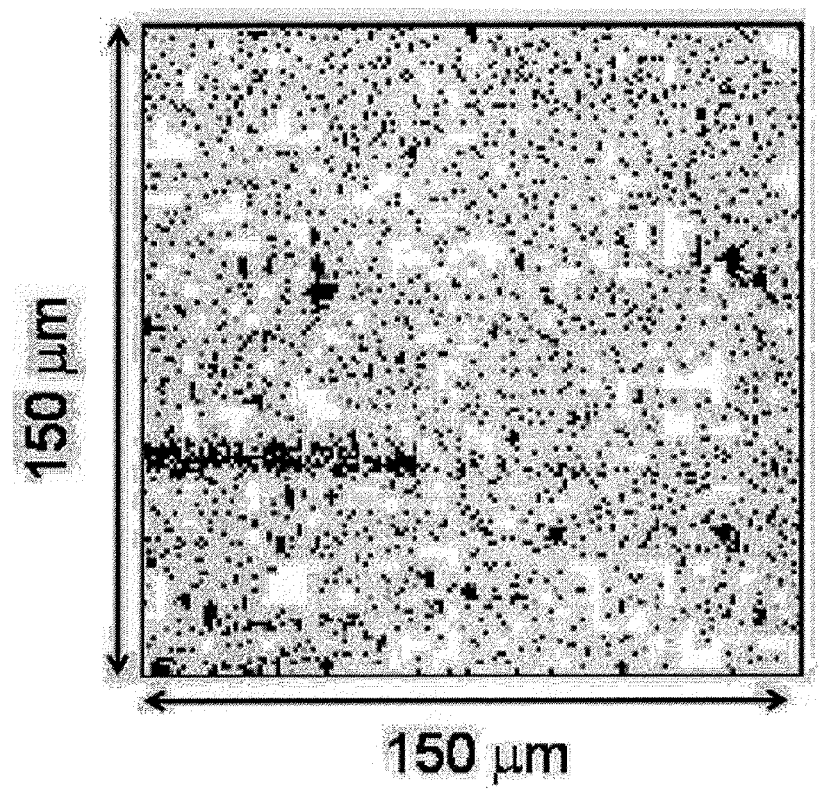
FIG. 7 is a diagram illustrating the results of Raman mapping measurement performed in a square-shaped area, the side of which being 150 μm, in which a white region indicates a region satisfying I(2D)/I(G)≥2 and a black region indicates a region satisfying I(2D)/I(G)<2 or a region where a D band was observed.

Then, in the center of a surface of a square-shaped area, the side of which being 10 mm of a carbon film laminate, Raman measurement was performed in a square-shaped area, the side of which being 150 μm so as to completely fill the square-shaped area, the side of which being 150 μm with laser beam spots every 1 μm of each beam spot size, in other words, Raman measurement was performed at measurement points (151×151=22,801 points) per position. FIG. 7 shows the results of the measurement, in which a white region indicates a region satisfying I(2D)/I(G)≥2 and a black region indicates a region satisfying I(2D)/I(G)<2 or a region where a D band was observed. Thus, it was determined that substantially all of the measured field (at measurement points 18,840 in all of 22,801) satisfied I(2D)/I(G)≥2, and that graphene was formed in the substantially entire square-shaped area, the side of which being 150 μm. Accordingly, it was found that in the carbon film laminate of the present invention, graphene has a square-shaped area, the side of which being 150 μm or more.

Figure 8:
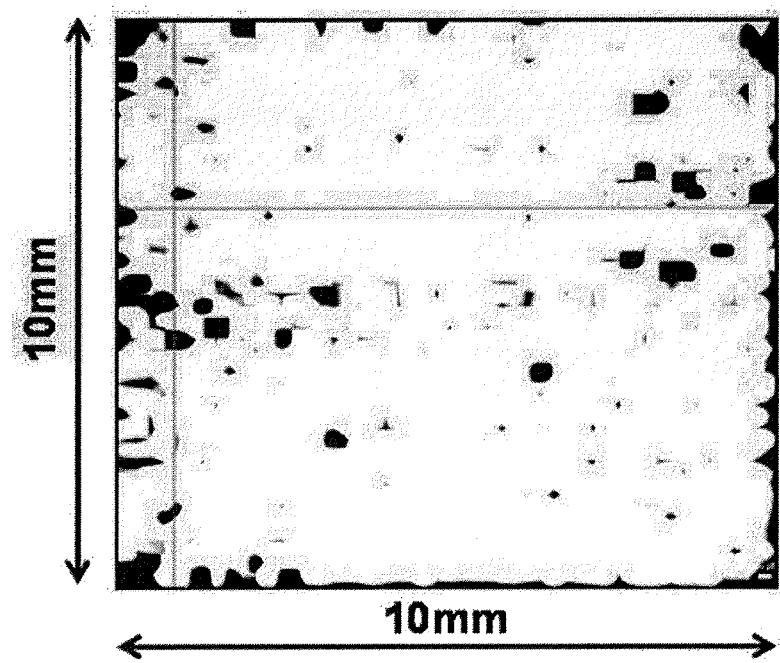
FIG. 8 is a diagram illustrating the results of Raman mapping measurement performed in a square-shaped area, the side of which being 10 mm, in which a white region indicates a region satisfying I(2D)/I(G)≥2 and a black region indicates a region satisfying I(2D)/I(G)<2 or a region where a D band was observed.

Next, in the entire area of a surface of a square-shaped area, the side of which being 10 mm of a carbon film laminate, Raman measurement was performed every 200 μm (i.e., 51×51=2,601 measurement points). FIG. 8 shows the results of the measurement, in which a white region indicates a region satisfying $I(2D)/I(G) \geq 2$ and a black region indicates a region satisfying $I(2D)/I(G) < 2$ or a region where D band was observed. Thus, it was found that substantially all of the square-shaped area, the side of which being 10 mm (2,131 measurement points in all of 2,601 measurement points) satisfies $I(2D)/I(G) \geq 2$, and that graphene is formed on almost all the entire square-shaped area, the side of which being 10 mm.

As mentioned above, it became possible to obtain graphene having a noticeably larger crystal, as compared with conventional thermal CVD synthesis of graphene using the copper foil, by a carbon film laminate including a sapphire (0001) single crystal substrate, a copper (111) single crystal thin film formed by epitaxial growth on the substrate, and graphene deposited on the copper (111) single crystal thin film of the present invention.

It is also possible to obtain graphene having a large crystal size by peeling graphene deposited on a surface of a copper (111) single crystal thin film from the copper (111) single crystal thin film in the carbon film laminate of the present invention.

The invention claimed is:

1. A carbon film laminate, comprising:
   a single crystal substrate,
   a copper single crystal thin film formed by epitaxial growth on the substrate, and
   a single layer graphene formed on the copper single crystal thin film,
   wherein the copper single crystal thin film is copper (111) or copper (100),
   wherein the single crystal substrate is a sapphire single crystal substrate comprising:
   a surface composed of terrace surfaces flat at the atomic level, and
   atomic-layer steps, having at most 0.3° of plane direction in tolerance,
   and having at most 0.020 mm of parallelism at both ends of the substrate of 10 mm in width.

2. The carbon film laminate according to claim 1, wherein the graphene is formed by a thermal CVD method using a hydrogen gas and a methane gas under reduced pressure.

3. The carbon film laminate according to claim 1, wherein the single crystal substrate is sapphire (0001).

* * * * *